United States Patent
Grno

(10) Patent No.: US 7,304,467 B2
(45) Date of Patent: Dec. 4, 2007

(54) CIRCUIT FOR SIMULTANEOUS TESTING OF ELECTRICITY METERS WITH INTERCONNECTED CURRENT AND VOLTAGE CIRCUITS

(76) Inventor: Ladislav Grno, Dlhe Diely 11/8, 841 04 Bratislava (SK)

( * ) Notice: Subject to any disclaimer, the term of this patent is extended or adjusted under 35 U.S.C. 154(b) by 0 days.

(21) Appl. No.: 11/020,381

(22) Filed: Dec. 22, 2004

(65) Prior Publication Data
US 2005/0151531 A1    Jul. 14, 2005

Related U.S. Application Data

(63) Continuation-in-part of application No. PCT/SK2002/000014, filed on Jun. 25, 2002.

(51) Int. Cl.
*G01R 11/32* (2006.01)
*G01R 7/00* (2006.01)
*G01R 17/06* (2006.01)

(52) U.S. Cl. ............... 324/74; 324/142; 324/99 D
(58) Field of Classification Search ............ 324/74, 324/142, 99 D; 702/85
See application file for complete search history.

(56) References Cited

U.S. PATENT DOCUMENTS

| | | | |
|---|---|---|---|
| 2,599,378 A | 6/1952 | Fleischmann | |
| 2,701,859 A * | 2/1955 | Coleman | 324/74 |
| 2,989,696 A | 6/1961 | Randolph | |
| 3,304,479 A * | 2/1967 | Kuris et al. | 318/118 |
| 3,841,157 A * | 10/1974 | Willock | 73/714 |
| 4,616,174 A * | 10/1986 | Jorgensen | 324/117 R |
| 5,539,304 A | 7/1996 | Payne | |
| 6,815,942 B2 * | 11/2004 | Randall et al. | 324/142 |

* cited by examiner

*Primary Examiner*—Ha Tran Nguyen
*Assistant Examiner*—Roberto Velez
(74) *Attorney, Agent, or Firm*—Simpson & Simpson, PLLC

(57) ABSTRACT

Circuit arrangement for simultaneous testing of electricity meters with interconnected current and voltage circuits comprising plurality of said meters having all voltage terminals associated with the same phase connected parallel to respective voltage source and each of the current terminal pairs of the meters connected to the output of individual zero flux current transducer (ZFCT). The inputs (IW) of the zero flux current transducer, the outputs of which are associated with the same phase of individual meters, are connected in series to a respective current source (I). The zero flux current transducer consists of an input winding (IW), an output winding (OW), a sense winding (SW), a drive winding (DW), a sense core (SC), a drive core (DC) and an amplifier (A). The drive winding comprises the drive core only and the input, output and sense windings comprise both sense core and drive core. The sense winding is connected to high impedance input of the amplifier and the drive winding is connected to low impedance output of the amplifier. The gain of the amplifier is equal to the ratio of turns of the drive winding and sense winding.

23 Claims, 2 Drawing Sheets

CIRCUIT FOR SIMULTANEOUS TESTING OF ELECTRICITY METERS WITH INTERCONNECTED CURRENT AND VOLTAGE CIRCUITS

CROSS REFERENCE TO RELATED APPLICATION

This application claims the benefit under 35 U.S.C. 120 and 35 U.S.C. 365(c) as a continuation-in-part of International Application PCT/SK2002/000014, filed 25 Jun. 2002, and published 31 Dec. 2003;

TECHNICAL FIELD

The invention is related to electrical circuit arrangement for simultaneous testing of electricity meters with interconnected current and voltage circuits.

BACKGROUND OF THE INVENTION

Testing of electricity meters with interconnected current and voltage circuits i.e. closed I-P links is an increasing need for meter manufacturers and meter operators. The meters that do not allow to open the links between the current and voltage measuring circuits (I-P links) for test or calibration purposes are increasingly in use. There are several reasons for this but the most important for manufacturers is the lower manufacturing cost of meters using resistive shunts for current measurement. To provide the facility to isolate the current and voltage paths of these meters would result in a significantly higher manufacturing cost. During normal operation, this isolation would not even be technically feasible. A reason for using meters with non-removable I-P links is to prevent their misuse for fraud. Another reason for testing meters with interconnected current and voltage circuits might be reduction of additional work needed for manipulation with the links before and after testing i.e. increasing of testing capacity and reduction of cost at high volume testing sites.

During meter testing the source is normally used as a phantom load to provide test currents and voltages applied to both the meters under test and the reference meter. The current flowing into current terminal is supplied separately from the required test voltage. Electronic meter test installations configured in this way allow simultaneously testing of any number of meters limited only by mechanical and power capacity of the test system. The separation of current and voltage measurement circuits at each meter is achieved by disconnecting of links in the terminal block (I-P links). Disconnection avoids interaction of current and voltage circuits and thus large unpredictable measurement error. If the meter under test has closed I-P links, then the interconnection between voltage and current circuit should be eliminated. The principle of testing with closed I-P links is based on isolating the individual voltage and current sources of each meter instead of isolating the voltage and current circuits of the meter. If the test system is dedicated only for Single-phase meters, the isolation of each meter can be realized either using individual isolated voltage source or using individual isolated current source for each installed meter.

The voltage source isolation can be solved either using individual precision voltage transformer advantageously with 1:1 ratio at each meter or using special common voltage transformer with separate output voltage winding for each meter. In this case the test rack must be equipped with multiple voltage wiring network for individual connection of voltage terminals of each meter to respective winding of the common transformer (the transformer is known generally as a multi-secondary voltage isolation voltage transformer or MSIVT). The number of secondary windings is at least equal to the number of meters under test, plus an additional one for the reference meter connection. These transformers are specifically manufactured and calibrated for this purpose and the windings are typically matched to within 0.1%. The additional error introduced by the transformer depends on the load impedance created by the voltage circuit of the tested meters. As the voltage circuit impedance of electricity meter is not subject of metrological specification, the error of the individual winding of the isolation transformer is unpredictable especially at testing different meters.

The required isolation can be achieved by using transformers in the current circuits with one current transformer per phase for each test position. In this way, each meter under test is supplied with isolated test currents. These transformers advantageously have a current ratio of 1:1 and should have amplitude and phase errors over the required current range small enough as not to introduce significant additional errors. The current transformers should be constructed to transfer relatively large (approximately 5 decades) range of current used for meter testing. The size, weight and the cost and of such transformer is serious due to calculation using maximum transferred power and negligible phase error comparable to used precision reference meter.

In classic approach of the non-linearity inherent in these transformers, degrade the overall accuracy of the system at lower currents.

Therefore, it is an object for this invention to provide new and improved arrangement of test circuit with isolating arrangement reducing the size and cost with high precision capability.

SUMMARY OF THE INVENTION

Circuit arrangement for simultaneous testing of single-phase electricity meters interconnected current and voltage circuits comprising a plurality of said meters having current terminals connected in series to respective current source and voltage terminal pairs of the meters connected to the output of individual electronically compensated voltage transducer. The inputs of electronically compensated voltage transducer are connected in parallel to common voltage source.

The zero flux current transducer consists of input winding, output winding, sense winding, drive winding, sense core, drive core and amplifier. The drive winding comprises drive core only and the input winding, output winding and sense winding comprise both sense core and drive core. The sense winding is connected to the input of the amplifier and the drive winding is connected to the output of the amplifier.

In a possible alternative circuit arrangement the drive winding comprises drive core only, sense winding comprises sense core only and input winding and output winding comprise both sense core and drive core. The sense winding is connected to the input of the amplifier and the drive winding is connected to the output of the amplifier.

In order to avoid DC offset on the output of the amplifier, the output of the amplifier is interconnected with the input of the low-pass filter and the sense winding interconnects the output of the low-pass filter with input of the amplifier. The negative feedback minimizes the DC offset.

Stability of the feedback loop can be improved by setting pass-band voltage gain of the low-pass filter to less than unity.

Construction of the low-pass filter using distributed parameter RC structure can improve the flatness of the amplitude and phase transfer function in the pass band of the transducer. Generally, the input winding constitutes the input of the zero flux current transducer and the output winding constitutes the output of the zero flux current transducer.

Separation of voltage and current circuits is possible by arrangement where current terminals of all meters are connected in series to a common current source and the voltage terminals of each meter are connected to the output of a individual zero flux voltage transducer. The inputs of all zero flux voltage transducers are connected parallel to a voltage source. The basic version of zero flux voltage transducer consists of input winding, output winding, drive winding, sense core and drive core. The drive winding comprises the drive core only. The input winding and output winding comprise both the sense core and drive core. The drive winding is connected in parallel to the input winding.

More precise version of zero flux voltage transducer consists of input winding, output winding, sense winding, drive winding, sense core, drive core and amplifier. The drive winding comprises the drive core only. The input winding, output winding and sense winding comprise both the sense core and drive core. The sense winding is connected to input of the amplifier and the drive winding is connected to output of the amplifier.

Alternative configuration of zero flux voltage transducer consists of input winding, output winding, sense winding, drive winding, sense core, drive core and amplifier. The drive winding comprises the drive core only and the sense winding comprises the sense core only. The input winding and the output winding comprise both the sense core and the drive core. The sense winding is connected to the input of the amplifier and the drive winding is connected to the output of the amplifier.

Generally, the input winding constitutes the input of the zero flux voltage transducer and the output winding constitutes the output of the zero flux voltage transducer.

Minimization of power supplied by control electronics is achieved by circuit arrangement where the zero flux voltage transducer is equipped with power transformer and error amplifier. The power transformer is equipped with first winding and second winding. The first winding and the input winding are connected in parallel to the voltage source. The second winding, the output terminals of the error amplifier and voltage terminals tested meter are connected in senes. The output winding is interconnected between the input of the error amplifier and the terminal of the second winding. Mainly the power transformer supplies the power consumed by the tested meter. The error amplifier supplies the power corresponding to the error of the power transformer.

DESCRIPTION OF PREFERRED EMBODIMENT

Figure 1:
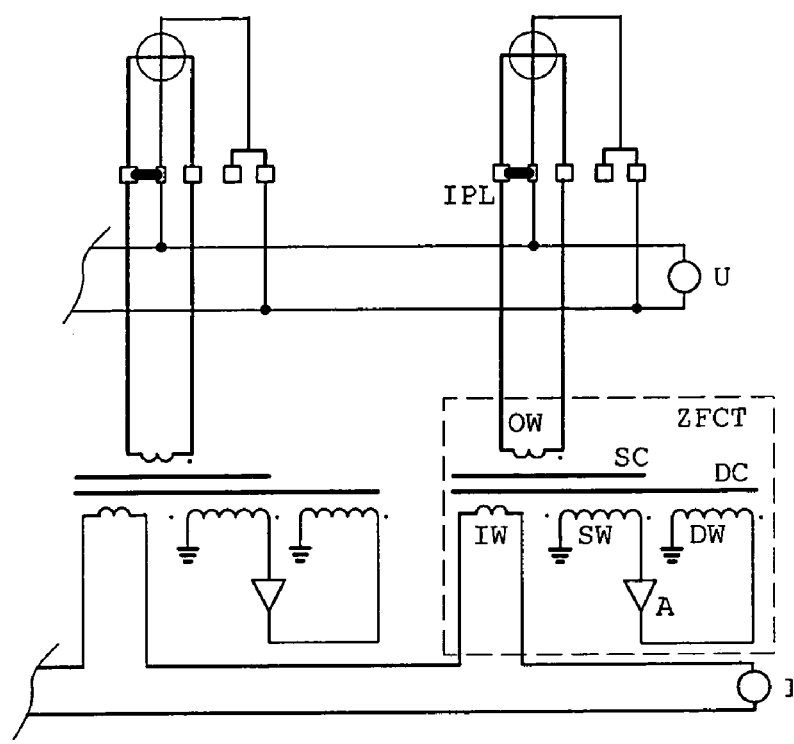
FIG. 1 shows an example fragment of circuit arrangement for simultaneous testing of meters with interconnected current and voltage circuits according to the invention.

FIG. 1 shows an example fragment of circuit arrangement of two meters with interconnected current and voltage circuits via closed current-potential links IPL. This arrangement is extendable to multiple meters adding further meters and/or further phase voltage circuits and current circuits into the meters with the same configuration of the current separating path. The meters' voltage terminals, associated with the same phase, are connected parallel to respective voltage source U. The current terminal pairs of the meters are connected to the output winding OW of individual zero flux current transducer ZFCT. The inputs of zero flux current transducer ZFCT created by the input windings IW are connected in series to current source I.

The drive winding DW of zero flux current transducer ZFCT comprises drive core DC only. The input winding IW, output winding OW and sense winding SW comprise both sense core SC and drive core DC. The sense winding SW is connected to the input of the amplifier A and the drive winding DW is connected to the output of amplifier A. If the number of turns of both the drive winding DW and sense winding SW is the same the ratio i.e., the gain of amplifier A is unity. In this case a voltage follower with high input impedance and low output impedance can be used.

The arrangement ensures zero magnetic flux in the sense winding SW by forcing the same induced voltage per turn on the driving winding DW as the sum of induced voltages per turn on both the driving winding DW and the sense winding SW. This way the induced voltage on the sense winding SW is zero. The current transfer from the input winding IW to the output winding OW is then practically determined only by the turn ratio. The current transfer is then independent on magnetic properties and excitement of the core and thus on the amplitude of the transferred current as well.

The magnetizing current of the drive core DC is fed from the amplifier A. Due to significant amplitude and phase error reduction of the zero flux arrangement compare to simple current transformer the circuit according to the invention enables significant reduction of the magnetic core volume with advantage of significant decrease of the core magnetizing power.

In practical test circuit a simple low power operational amplifier based follower can be used in position of amplifier A up to test currents in order 100 Amperes with transducer accuracy in order 0.01% at fractional equipment weight and cost compare to classic current transformer.

The arrangement in which the sense winding comprises only the sense core works similarly. The high gain amplifier directly controls the zero flux condition of the sense core.

Figure 2:
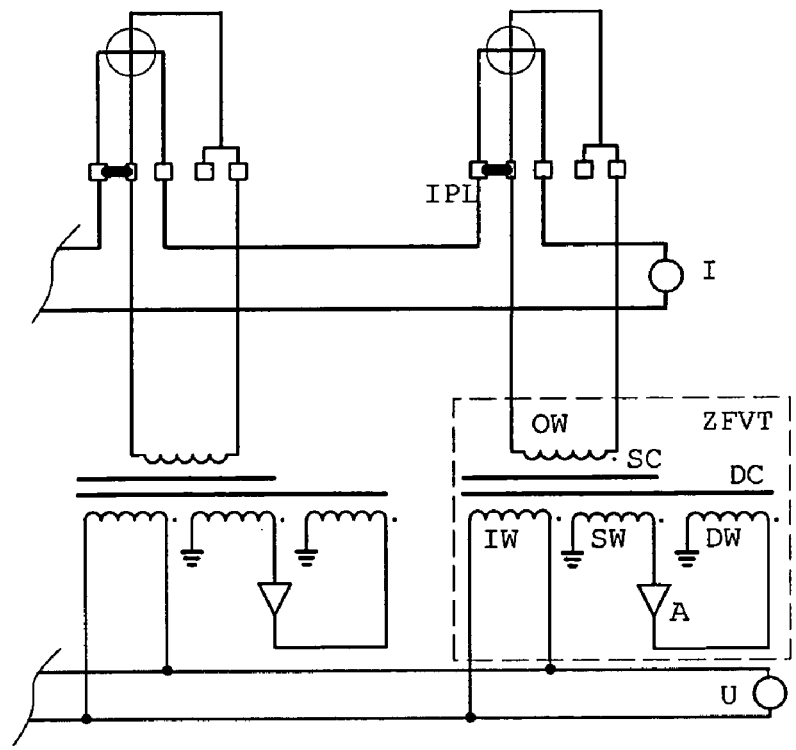
FIG. 2 shows another example fragment of circuit arrangement for simultaneous testing of meters with interconnected current and voltage circuits according to the invention.

FIG. 2. shows an example fragment of circuit arrangement for simultaneous testing of electricity meters with interconnected current and voltage circuits with the current terminals of all meters connected in series to common current source I and the voltage terminals of each meter connected to the output of individual zero flux voltage transducer ZFVT. Inputs of all zero flux voltage transducers ZFVT are connected parallel to voltage source U. The zero flux voltage transducer ZFVT consists of input winding IW, output winding OW, sense winding SW, drive winding DW, sense core SC, drive core DC and amplifier A. The drive winding DW comprises the drive core DC only. The input winding IW, output winding OW and sense winding SW comprise both the sense core SC and drive core DC. The sense winding SW is connected to input of the amplifier A and the drive winding DW is connected to output of the amplifier A.

Figure 3:
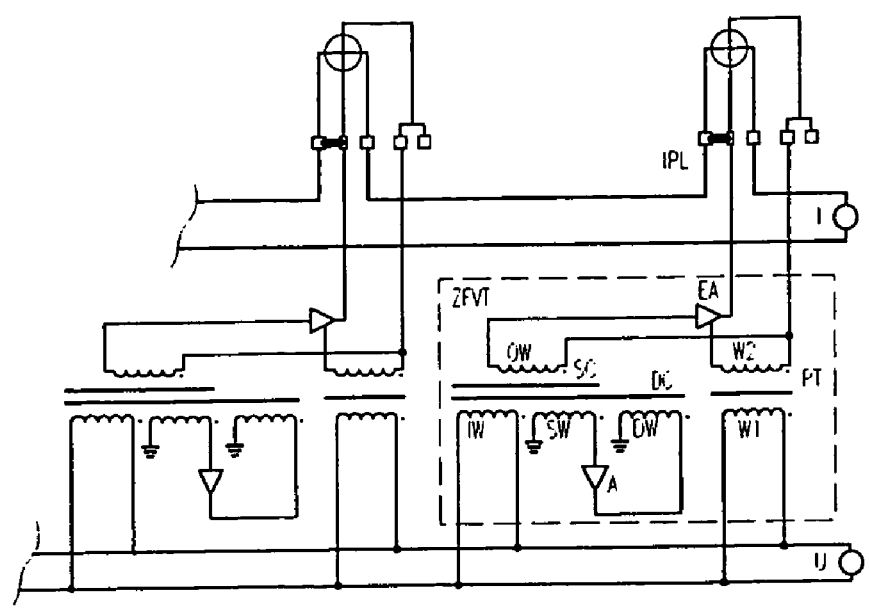
FIG. 3 shows further example fragment of circuit arrangement for simultaneous testing of single-phase meters with interconnected current and voltage circuits according to the invention.

FIG. 3. shows an example fragment of circuit arrangement for simultaneous testing of electricity meters with interconnected current and voltage circuits equipped with power transformer PT and error amplifier EA. The power transformer PT is equipped with first winding W1 and second winding W2. The first winding W1 and the input winding IW are connected in parallel to voltage source U. The second winding W2, the output terminals of the error amplifier EA and voltage terminals of the tested meter are connected in series. The output winding OW is interconnected between input of the error amplifier EA and the terminal of the second winding W2.

Figure 4:
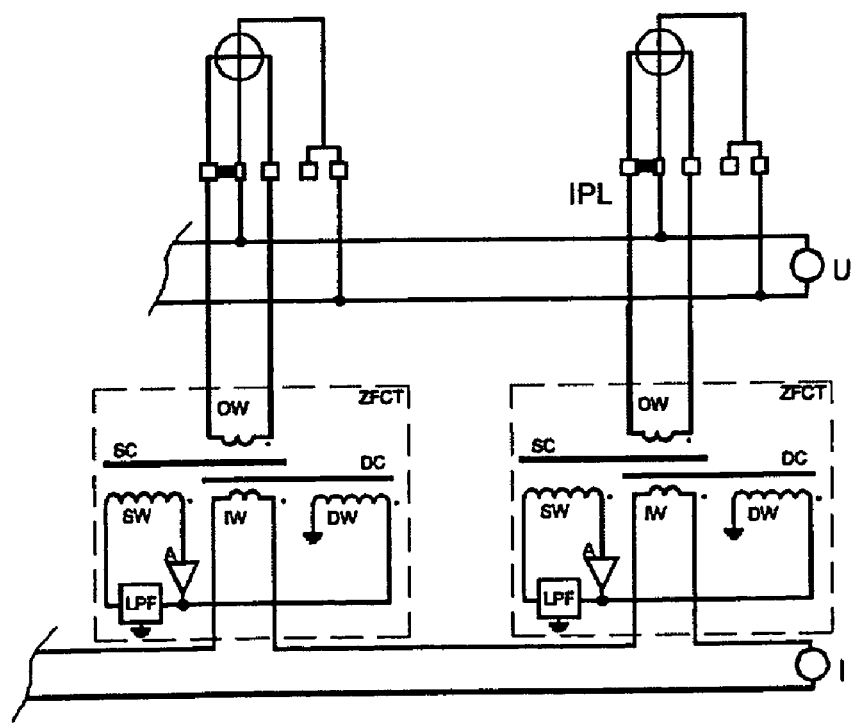
FIG. 4 shows further example fragment of circuit arrangement for simultaneous testing of single-phase meters with interconnected current and voltage circuits according to the invention.

FIG. 4 shows an example fragment of circuit arrangement of two single-phase meters with interconnected current and voltage circuits via closed current-potential links IPL. This arrangement is extendable to multiple meters adding further meters and/or further phase voltage circuits and current circuits into the meters with the same configuration of the current separating path.

The meters' voltage terminals, associated with the same phase, are connected parallel to respective voltage source U. The current terminal pairs of the meters are connected to the output winding OW of individual zero flux current transducer ZFCT. The inputs of zero flux current transducer ZFCT created by the input winding IW are connected in series to current source I.

The drive winding DW comprises drive core DC only. The sense winding SW comprises sense core SC only. The input winding IW and the output winding OW comprise both sense core SC and drive core DC. The sense winding SW is connected to input of the amplifier A. The drive winding DW is connected to output of amplifier A. Output of the amplifier A is interconnected with input of the low-pass filter LPF. First terminal of the sense winding SW is connected to output of the low-pass filter LPF and second terminal of the sense winding SW is connected to input of the amplifier A. The arrangement ensure zero magnetic flux in the sense winding SW via the amplifier A controlling the current of the driving winding DW. The low-pass filter LPF serves for DC stability of the amplifier.

I claim:

1. Circuit arrangement for simultaneous testing of a plurality of electricity meters with interconnected current and voltage circuits comprising a plurality of said meters having all voltage terminals associated with the same phase connected parallel to respective voltage source wherein each of the current terminal pairs of the meters is connected to the output of individual zero flux current transducer (ZFCT) and magnetically coupled to the inputs of said zero flux current transducer (ZFCT), wherein said inputs of said zero flux current transducer (ZFCT), which are associated with the same phase of individual meters, are connected in series to respective current source and wherein said ZFCT is arranged to perform an analog separation of said interconnected current and voltage circuits.

2. Circuit arrangement for simultaneous testing of a plurality of electricity meters with interconnected current and voltage circuits according to claim 1 wherein said zero flux current transducer (ZFCT) consists of input winding (IW), output winding (OW), sense winding (SW), drive winding (DW), sense core (SC), drive core (DC) and amplifier (A), said drive winding (DW) comprises drive core (DC) only and said input winding (IW), output winding (OW) and sense winding (SW) comprise both sense core (SC) and drive core (DC) and said sense winding (SW) is connected to input of amplifier (A), and said drive winding (DW) is connected to output of amplifier (A).

3. Circuit arrangement for simultaneous testing of a plurality of electricity meters with interconnected current and voltage circuits according to claim 2, wherein the input winding (IW) constitutes the input of the zero flux current transducer (ZFCT) and the output winding (OW) constitutes the output of the zero flux current transducer (ZFCT).

4. Circuit arrangement for simultaneous testing of a plurality of electricity meters with interconnected current and voltage circuits according to claim 2 wherein gain of the amplifier (A) is equal to ratio of turns of the drive winding (DW) and sense winding (SW).

5. Circuit arrangement for simultaneous testing of a plurality of electricity meters with interconnected current and voltage circuits according to claim 2, wherein said sense core (SC) and/or drive core (DC) are/is split into plurality of partial cores.

6. Circuit arrangement for simultaneous testing of a plurality of electricity meters with interconnected current and voltage circuits according to claim 1 wherein said zero flux current transducer (ZFCT) consists of input winding (IW), output winding (OW), sense winding (SW), drive winding (DW), sense core (SC), drive core (DC) and amplifier (A), said drive winding (DW) comprises drive core (DC) only, sense winding (SW) comprises sense core (SC) only whereas input winding (IW) and output winding (OW) comprise both sense core (SC) and drive core (DC), said sense winding (SW) is connected to input of amplifier (A), and said the drive winding (DW) is connected to output of amplifier (A).

7. Circuit arrangement for simultaneous testing of a plurality of electricity meters with interconnected current and voltage circuits according to claim 6 wherein output of the amplifier (A) is interconnected with input of low-pass filter (LPF), a first terminal of the sense winding (SW) is connected to output of the low-pass filter (LPF), a second terminal of the sense winding (SW) is connected to input of the amplifier (A).

8. Circuit arrangement for simultaneous testing of a plurality of electricity meters with interconnected current and voltage circuits according to claim 7 wherein pass-band voltage gain of the low-pass filter (LPF) is less than unity.

9. Circuit arrangement for simultaneous testing of a plurality of electricity meters with interconnected current and voltage circuits according to claim 7 wherein at least one part of the low-pass filter (LPF) consists of distributed parameter RC structure.

10. Circuit arrangement for simultaneous testing of a plurality of electricity meters with interconnected current and voltage circuits comprising a plurality of said meters wherein current terminals of all said meters are connected in series to a common current source and voltage terminals of each meter are connected to the output of an individual zero flux voltage transducer (ZFVT) and inputs of all zero flux voltage transducers (ZFVT) are connected parallel to a voltage source and wherein said ZFCT is arranged to perform an analog separation of said interconnected current and voltage circuits.

11. Circuit arrangement for simultaneous testing of a plurality of electricity meters with interconnected current and voltage circuits according to claim 10 wherein said zero flux voltage transducer (ZFVT) comprises input winding (IW), output winding (OW), drive winding (DW), sense core (SC) and drive core (DC) and the drive winding (DW) comprises the drive core (DC) only, wherein the input winding (IW) and output winding (OW) comprise both the sense core (SC) and drive core (DC) and the drive winding (DW) is connected in parallel to the input winding (IW).

12. Circuit arrangement for simultaneous testing of a plurality of electricity meters with interconnected current and voltage circuits according to claim 11, wherein the input winding (IW) constitutes the input of the zero flux voltage transducer (ZFVT) and the output winding (OW) constitutes the output of the zero flux voltage transducer (ZFVT).

13. Circuit arrangement for simultaneous testing of a plurality of electricity meters with interconnected current and voltage circuits according to claim 11 equipped with power transformer (PT) and error amplifier (EA) and the power transformer (PT) is equipped with first winding (W1) and second winding (W2) and the first winding (W1) and the input winding (IW) are connected in parallel to voltage source and the second winding (W2), the output terminals of the error amplifier (EA) and voltage terminals of said meter are connected in series and the output winding (OW) is interconnected between input of the error amplifier (EA) and the terminal of the second winding (W2).

14. Circuit arrangement for simultaneous testing of a plurality of electricity meters with interconnected current and voltage circuits according to claim 10 wherein said zero flux voltage transducer (ZFVT) consists of input winding (IW), output winding (OW), sense winding (SW), drive winding (DW), sense core (SC), drive core (DC) and amplifier (A), and the drive winding (DW) comprises the drive core (DC) only and the input winding (IW), output winding (OW) and sense winding (SW) comprise both the sense core (SC) and drive core (DC) and the sense winding (SW) is connected to input of the amplifier (A), and the drive winding (DW) is connected to output of the amplifier (A).

15. Circuit arrangement for simultaneous testing of a plurality of electricity meters with interconnected current and voltage circuits according to claim 10 wherein said zero flux voltage transducer (ZFVT) consists of input winding (IW), output winding (OW), sense winding (SW), drive winding (DW), sense core (SC), drive core (DC) and amplifier (A) and the drive winding (DW) comprises the drive core (DC) only and the sense winding (SW) comprises the sense core (SC) only and the input winding (IW) and the output winding (OW) comprise both the sense core (SC) and the drive core (DC) and the sense winding (SW) is connected to input of the amplifier (A), and the drive winding (DW) is connected to output of the amplifier (A).

16. Circuit arrangement for simultaneous testing of a plurality of electricity meters with interconnected current and voltage circuits comprising a plurality of said meters having all voltage terminals associated with the same phase connected parallel to respective voltage source wherein each of the current terminal pairs of the meters is connected to the output of individual zero flux current transducer (ZFCT) and magnetically coupled to the inputs of said zero flux current transducer (ZFCT), wherein said inputs of said zero flux current transducer (ZFCT), which are associated with the same phase of individual meters, are connected in series to respective current source wherein said zero flux current transducer (ZFCT) consists of input winding (IW), output winding (OW), sense winding (SW), drive winding (DW), sense core (SC), drive core (DC) and amplifier (A), said drive winding (DW) comprises drive core (DC) only, sense winding (SW) comprises sense core (SC) only whereas input winding (IW) and output winding (OW) comprise both sense core (SC) and drive core (DC), said sense winding (SW) is connected to input of amplifier (A), and said the drive winding (DW) is connected to output of amplifier (A).

17. Circuit arrangement for simultaneous testing of a plurality of electricity meters with interconnected current and voltage circuits according to claim 16 wherein output of the amplifier (A) is interconnected with input of low-pass filter (LPF), a first terminal of the sense winding (SW) is connected to output of the low-pass filter (LPF), a second terminal of the sense winding (SW) is connected to input of the amplifier (A).

18. Circuit arrangement for simultaneous testing of a plurality of electricity meters with interconnected current and voltage circuits according to claim 17 wherein pass-band voltage gain of the low-pass filter (LPF) is less than unity.

19. Circuit arrangement for simultaneous testing of a plurality of electricity meters with interconnected current and voltage circuits according to claim 17 wherein at least one part of the low-pass filter (LPF) consists of distributed parameter RC structure.

20. Circuit arrangement for simultaneous testing of a plurality of electricity meters with interconnected current and voltage circuits comprising a plurality of said meters wherein current terminals of all said meters are connected in series to a common current, source and voltage terminals of each meter are connected to the output of an individual zero flux voltage transducer (ZFVT) and inputs of all zero flux voltage transducers (ZFVT) are connected parallel to a voltage source wherein said zero flux voltage transducer (ZFVT) consists of input winding (IW), output winding (OW), sense winding (SW), drive winding (DW), sense core (SC), drive core (DC) and amplifier (A) and the drive winding (DW) comprises the drive core (DC) only and the sense winding (SW) comprises the sense core (SC) only and the input winding (IW) and the output winding (OW) comprise both the sense core (SC) and the drive core (DC) and the sense winding (SW) is connected to input of the amplifier (A), and the drive winding (DW) is connected to output of the amplifier (A).

21. Circuit arrangement for simultaneous testing of a plurality of electricity meters with interconnected current and voltage circuits according to claim 20 equipped with power transformer (PT) and error amplifier (EA) and the power transformer (PT) is equipped with first winding (W1) and second winding (W2) and the first winding (W1) and the input winding (IW) are connected in parallel to voltage source and the second winding (W2), the output terminals of the error amplifier (EA) and voltage terminals of said meter are connected in series and the output winding (OW) is interconnected between input of the error amplifier (EA) and the terminal of the second winding (W2).

22. Circuit arrangement for simultaneous testing of a plurality of electricity meters with interconnected current and voltage circuits comprising a plurality of said meters having all voltage terminals associated with the same phase connected parallel to respective voltage source wherein each of the current terminal pairs of the meters is connected to the output of individual zero flux current transducer (ZFCT) and magnetically coupled to the inputs of said zero flux current transducer (ZFCT), wherein said inputs of said zero flux current transducer (ZFCT), which are associated with the same phase of individual meters, are connected in series to respective current source, wherein said zero flux current transducer (ZFCT) consists of input winding (IW), output winding (OW), sense winding (SW), drive winding (DW), sense core (SC), drive core (DC) and amplifier (A), said drive winding (DW) comprises drive core (DC) only and said input winding (IW), output winding (OW) and sense winding (SW) comprise both sense core (SC) and drive core (DC) and said sense winding (SW) is connected to input of amplifier (A), and said drive winding (DW) is connected to output of amplifier (A), and wherein gain of the amplifier (A) is equal to ratio of turns of the drive winding (DW) and sense winding (SW).

23. Circuit arrangement for simultaneous testing of a plurality of electricity meters with interconnected current and voltage circuits comprising a plurality of said meters having all voltage terminals associated with the same phase connected parallel to respective voltage source wherein each of the current terminal pairs of the meters is connected to the output of individual zero flux current transducer (ZFCT) and magnetically coupled to the inputs of said zero flux current transducer (ZFCT), wherein said inputs of said zero flux current transducer (ZFCT), which are associated with the same phase of individual meters, are connected in series to respective current source, wherein said sense core (SC) and/or drive core (DC) are/is split into plurality of partial cores.

* * * * *